US011122231B2

(12) United States Patent
Negishi

(10) Patent No.: US 11,122,231 B2
(45) Date of Patent: Sep. 14, 2021

(54) IMAGE SENSOR AND CONTROL METHOD THEREOF, IMAGE CAPTURING APPARATUS, AND IMAGE PROCESSING APPARATUS

(71) Applicant: CANON KABUSHIKI KAISHA, Tokyo (JP)

(72) Inventor: Norio Negishi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/805,969

(22) Filed: Mar. 2, 2020

(65) Prior Publication Data

US 2020/0288077 A1 Sep. 10, 2020

(30) Foreign Application Priority Data

Mar. 5, 2019 (JP) .............................. JP2019-039808

(51) Int. Cl.

| H04N 5/378 | (2011.01) |
|---|---|
| H04N 5/345 | (2011.01) |
| H04N 5/376 | (2011.01) |
| H04N 5/369 | (2011.01) |
| H04N 9/04 | (2006.01) |
| H01L 27/146 | (2006.01) |
| H04N 5/353 | (2011.01) |

(Continued)

(52) U.S. Cl.
CPC ........... *H04N 5/378* (2013.01); *H04N 5/3456* (2013.01); *H04N 5/369* (2013.01); *H04N 5/3765* (2013.01); *H01L 27/14645* (2013.01); *H04N 9/04563* (2018.08)

(58) Field of Classification Search
CPC ...... G01S 7/4863; G01S 7/4865; G01S 7/486; G01S 7/4861; G01S 17/10; H01L 31/107; H01L 31/02027; H01L 27/14645; G01C 3/06; G01C 3/03; G01J 2001/442; H03K 21/00; H04N 5/3745; H04N 5/379; H04N 5/376; H04N 5/3765; H04N 5/3456; H04N 5/378; H04N 5/369; H04N 9/04563; H04N 5/3535; H04N 5/3741; H04N 5/37455

See application file for complete search history.

(56) References Cited

U.S. PATENT DOCUMENTS

| 9,431,439 B2 | 8/2016 | Soga et al. |
|---|---|---|
| 10,340,408 B1 * | 7/2019 | Katnani ................ H01L 31/107 |
| 10,491,843 B2 | 11/2019 | Ikedo |

(Continued)

FOREIGN PATENT DOCUMENTS

| JP | 2014-081253 A | 5/2014 |
|---|---|---|
| JP | 2018-198388 A | 12/2018 |

OTHER PUBLICATIONS

Office Action dated Feb. 12, 2021, in Japanese Patent Application No. 2019-039808.

*Primary Examiner* — Albert H Cutler
(74) *Attorney, Agent, or Firm* — Venable LLP

(57) ABSTRACT

An image sensor comprises: a plurality of pixels each having an avalanche photodiode; and a control unit that controls, for each of a plurality of pixel groups which are obtained by dividing the plurality of pixels, to supply either of a first voltage and a second voltage as a reverse bias voltage of the avalanche photodiodes, wherein the first voltage is greater than a breakdown voltage of the avalanche photodiodes and the second voltage is smaller than the breakdown voltage.

12 Claims, 7 Drawing Sheets

(51) Int. Cl.
*H04N 5/374* (2011.01)
*H04N 5/3745* (2011.01)

(56) References Cited

U.S. PATENT DOCUMENTS

| | | |
|---|---|---|
| 2013/0015331 A1* | 1/2013 | Birk .......................... G01J 1/44 250/208.2 |
| 2015/0200222 A1* | 7/2015 | Webster ............ H01L 27/14609 250/208.1 |
| 2016/0284743 A1 | 9/2016 | Mellot et al. |
| 2017/0139041 A1* | 5/2017 | Drader .................. G01S 7/4865 |
| 2017/0176579 A1* | 6/2017 | Niclass ................... G01S 17/42 |
| 2017/0179173 A1* | 6/2017 | Mandai ............. H01L 27/14643 |
| 2018/0180473 A1* | 6/2018 | Clemens ................. G01S 7/497 |

* cited by examiner

FIG. 4A
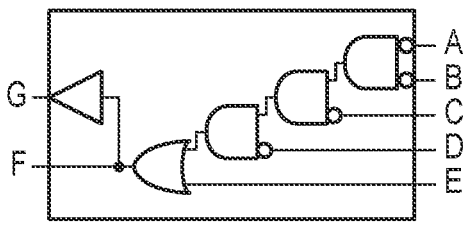
FIG. 4B
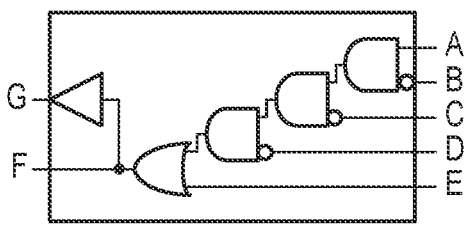
FIG. 4C
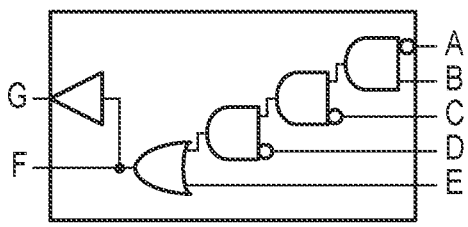
FIG. 4D
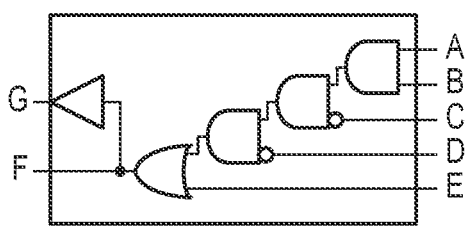
FIG. 4E
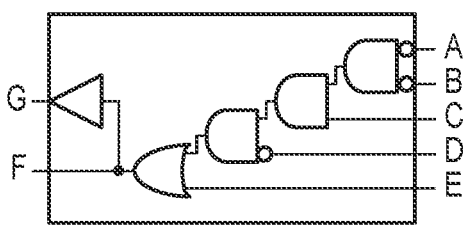
FIG. 4F
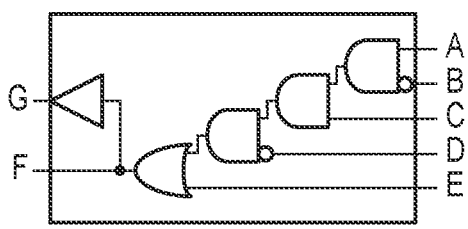
FIG. 4G
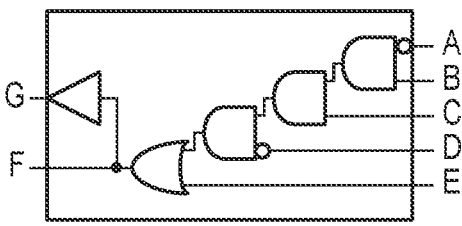
FIG. 4H
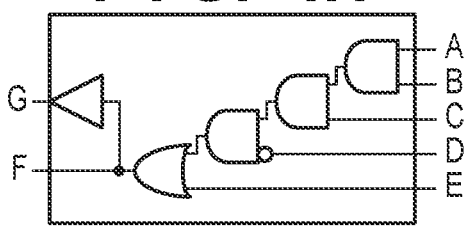
FIG. 4I
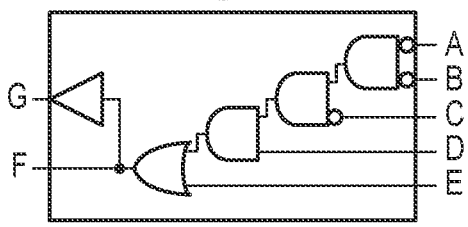
FIG. 4J
| PATTERN | GROUP TO BE TURNED ON | A | B | C | D | E |
|---|---|---|---|---|---|---|
| (1) | Group1 | L | L | L | L | L |
| (2) | Group2 | H | L | L | L | L |
| (3) | Group3 | L | H | L | L | L |
| (4) | Group4 | H | H | L | L | L |
| (5) | Group5 | L | L | H | L | L |
| (6) | Group6 | H | L | H | L | L |
| (7) | Group7 | L | H | H | L | L |
| (8) | Group8 | H | H | H | L | L |
| (9) | Group9 | L | L | L | H | L |
| (10) | ALL OFF | H | H | H | H | L |
| (11) | ALL ON | H | H | H | H | H |

FIG. 6A

| R1 | Gr3 | R2 | Gr1 | R3 | Gr2 | R1 | Gr3 | R2 | Gr1 | R3 | Gr2 |
|---|---|---|---|---|---|---|---|---|---|---|---|
| Gb7 | B9 | Gb8 | B7 | Gb9 | B8 | Gb7 | B9 | Gb8 | B7 | Gb9 | B8 |
| R4 | Gr6 | R5 | Gr4 | R6 | Gr5 | R4 | Gr6 | R5 | Gr4 | R6 | Gr5 |
| Gb1 | B3 | Gb2 | B1 | Gb3 | B2 | Gb1 | B3 | Gb2 | B1 | Gb3 | B2 |
| R7 | Gr9 | R8 | Gr7 | R9 | Gr8 | R7 | Gr9 | R8 | Gr7 | R9 | Gr8 |
| Gb4 | B6 | Gb5 | B4 | Gb6 | B5 | Gb4 | B6 | Gb5 | B4 | Gb6 | B5 |
| R1 | Gr3 | R2 | Gr1 | R3 | Gr2 | R1 | Gr3 | R2 | Gr1 | R3 | Gr2 |
| Gb7 | B9 | Gb8 | B7 | Gb9 | B8 | Gb7 | B9 | Gb8 | B7 | Gb9 | B8 |

FIG. 6B

| R1 | Gr3 | R2 | Gr1 | R3 | Gr2 | R1 | Gr3 | R2 | Gr1 | R3 | Gr2 |
|---|---|---|---|---|---|---|---|---|---|---|---|
| Gb7 | B9 | Gb8 | B7 | Gb9 | B8 | Gb7 | B9 | Gb8 | B7 | Gb9 | B8 |
| R4 | Gr6 | R5 | Gr4 | R6 | Gr5 | R4 | Gr6 | R5 | Gr4 | R6 | Gr5 |
| Gb1 | B3 | Gb2 | B1 | Gb3 | B2 | Gb1 | B3 | Gb2 | B1 | Gb3 | B2 |
| R7 | Gr9 | R8 | Gr7 | R9 | Gr8 | R7 | Gr9 | R8 | Gr7 | R9 | Gr8 |
| Gb4 | B6 | Gb5 | B4 | Gb6 | B5 | Gb4 | B6 | Gb5 | B4 | Gb6 | B5 |
| R1 | Gr3 | R2 | Gr1 | R3 | Gr2 | R1 | Gr3 | R2 | Gr1 | R3 | Gr2 |
| Gb7 | B9 | Gb8 | B7 | Gb9 | B8 | Gb7 | B9 | Gb8 | B7 | Gb9 | B8 |

☐ WEIGHT : 1     ▨ WEIGHT : 2     ▓ WEIGHT : 4

IMAGE SENSOR AND CONTROL METHOD THEREOF, IMAGE CAPTURING APPARATUS, AND IMAGE PROCESSING APPARATUS

BACKGROUND OF THE INVENTION

Field of the Invention

The present invention relates to a technique for driving an image sensor using avalanche photodiodes.

Description of the Related Art

Recent years have seen investigations into photon counting type image sensor that use an avalanche phenomenon occurring when avalanche photodiodes (APDs) are operated in Geiger mode to measure the number of incoming photons themselves and output that number as a digital signal. Such a photon counting type image sensor using an avalanche photodiode operated in Geiger mode is called SPAD (Single Photon Avalanche Diode).

When an APD is operated in Geiger mode, a large current is produced by the avalanche phenomenon when a single photon enters the APD, for example. By converting the current into a pulse signal and counting the number of pulse signals, the number of incoming photons can be measured directly. As such, SPAD is less affected by influence of noise, and an improvement in the S/N ratio can be anticipated. Japanese Patent Laid-Open No. 2014-81253 discloses a distance-measurement sensor constituted by the SPAD having a plurality of pixels as an example of a sensing device employing SPAD.

An overview of the operations of a conventional photon counting type image sensor will be given here using FIGS. 7A to 7C. FIG. 7A illustrates an equivalent circuit of a unit pixel (called simply a "pixel" hereinafter) of an image sensor in which the APDs operate in Geiger mode. The pixel is constituted by an APD 91, a quenching resistor 92, a comparator 93, and resistors $R_1$ and $R_2$.

The anode end of the APD 91 is grounded, while the cathode end is connected to the quenching resistor 92. A reverse bias voltage from a voltage HVDD is applied via the quenching resistor 92. At this time, a voltage difference between the voltage HVDD and GND is set to be greater than or equal to a breakdown voltage for putting the APD 91 into Geiger mode.

FIG. 7B illustrates a transition of a voltage $V_{APD}$ at the cathode end of the APD 91 from a photon waiting state to the occurrence of the avalanche phenomenon, and further to the photon waiting state again. A period from time t90 to t91 corresponds the photon waiting state, and when a photon enters the APD 91 at time t91, the avalanche phenomenon occurs. When the avalanche phenomenon occurs, a current flows and the voltage $V_{APD}$ drops, and the avalanche phenomenon stops (time t93), and returns to the original photon waiting state (time t95).

As illustrated in FIG. 7A, the voltage $V_{APD}$ at the cathode end of the APD 91 is input to one input terminal of the comparator 93, and a threshold voltage $V_{th}$ obtained by dividing a reference voltage $V_{ref}$ with the resistor $R_1$ and the resistor $R_2$ is input to the other input terminal. The threshold voltage $V_{th}$ is set to a potential between $V_0$ and $V_{min}$ so that a change in the voltage $V_{APD}$ can be detected when a photon enters, as described above.

The comparator 93 outputs a single pulse signal during the period from when the voltage $V_{APD}$ drops below $V_{th}$ when the voltage $V_{APD}$ once again surpasses the $V_{th}$ (a period in which the voltage $V_{APD}$ falls below and returns above the $V_{th}$ level).

FIG. 7C shows the output $V_{out}$ of the comparator 93 in a case where the voltage $V_{APD}$ at the cathode terminal of the APD 91 changes as shown in FIG. 7B. At time t92, the voltage $V_{APD}$ becomes smaller than $V_{th}$, and at time t94, $V_{APD}$ becomes larger than $V_{th}$ again. Therefore, one pulse signal is output during the period from t92 to t94.

If a counter 94 is connected to the comparator 93, the number of incident photons can be counted. Therefore, the number of photons incident on the APD 91 can be counted as the cycle of occurrence of the avalanche phenomenon from the photon waiting state, stop of the avalanche phenomenon, and return to the original photon waiting state is repeated.

However, it is necessary to apply a high voltage from the voltage source VDD in order to generate a high electric field to the photon counting type image sensor using APDs during the exposure period. Therefore, when all the pixels are exposed at the same time, power consumption sharply increases during the exposure period.

SUMMARY OF THE INVENTION

The present invention has been made in consideration of the above situation, and in a photon counting type image sensor, pixels that count photons can be selected.

According to the present invention, provided is an image sensor comprising: a plurality of pixels each having an avalanche photodiode; and a control unit that controls, for each of a plurality of pixel groups which are obtained by dividing the plurality of pixels, to supply either of a first voltage and a second voltage as a reverse bias voltage of the avalanche photodiodes, wherein the first voltage is greater than a breakdown voltage of the avalanche photodiodes and the second voltage is smaller than the breakdown voltage, and wherein the control unit is implemented by one or more processors, circuitry or a combination thereof.

Further, according to the present invention, provided is an image capturing apparatus comprising: an image sensor having: a plurality of pixels each having an avalanche photodiode; and a control unit that controls, for each of a plurality of pixel groups which are obtained by dividing the plurality of pixels, to supply either of a first voltage and a second voltage as a reverse bias voltage of the avalanche photodiodes, wherein the first voltage is greater than a breakdown voltage of the avalanche photodiodes and the second voltage is smaller than the breakdown voltage, and wherein the control unit includes a plurality of logic circuits, each having a plurality of input terminals, that have different configurations from each other and correspond to the plurality of pixel groups, respectively, wherein the plurality of logic circuits outputs different output signals with respect to a same combination of signals input to the plurality of input terminals as control signals for controlling the reverse bias voltage, and a unit that supplies the signals to be input to the plurality of input terminals of each of the plurality of logic circuits, wherein each unit is implemented by one or more processors, circuitry or a combination thereof.

Furthermore, according to the present invention, provided is an image processing apparatus comprising: an image sensor having: a plurality of pixels each having an avalanche photodiode; a control unit that controls, for each of a plurality of pixel groups which are obtained by dividing the plurality of pixels, to supply either of a first voltage and a second voltage as a reverse bias voltage of the avalanche photodiodes, wherein the first voltage is greater than a breakdown voltage of the avalanche photodiodes and the second voltage is smaller than the breakdown voltage; and counters that count numbers of pulse signals generated based on output of the avalanche photodiodes, and output count values, and a processing unit that processes the count values output from the image sensor and generates image data, wherein each unit is implemented by one or more processors, circuitry or a combination thereof.

Further, according to the present invention, provided is a control method of controlling an image sensor that has a plurality of pixels each having an avalanche photodiode, the method comprising: controlling, for each of a plurality of pixel groups which are obtained by dividing the plurality of pixels, to supply either of a first voltage and a second voltage as a reverse bias voltage of the avalanche photodiodes, wherein the first voltage is greater than a breakdown voltage of the avalanche photodiodes and the second voltage is smaller than the breakdown voltage.

Further, according to the present invention, provided is a non-transitory computer-readable storage medium, the storage medium storing a program that is executable by the computer, wherein the program includes program code for causing the computer to perform a control method of controlling an image sensor that has a plurality of pixels each having an avalanche photodiode, the method comprising: controlling, for each of a plurality of pixel groups which are obtained by dividing the plurality of pixels, to supply either of a first voltage and a second voltage as a reverse bias voltage of the avalanche photodiodes, wherein the first voltage is greater than a breakdown voltage of the avalanche photodiodes and the second voltage is smaller than the breakdown voltage.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIGS. 4A to 4J are diagrams illustrating configuration examples of a logic circuit and logic values with respect to input signals according to the embodiment;

FIGS. 6A and 6B are diagrams illustrating an example of the arrangement of pixel groups according to the embodiment.

DESCRIPTION OF THE EMBODIMENTS

Figure 1:
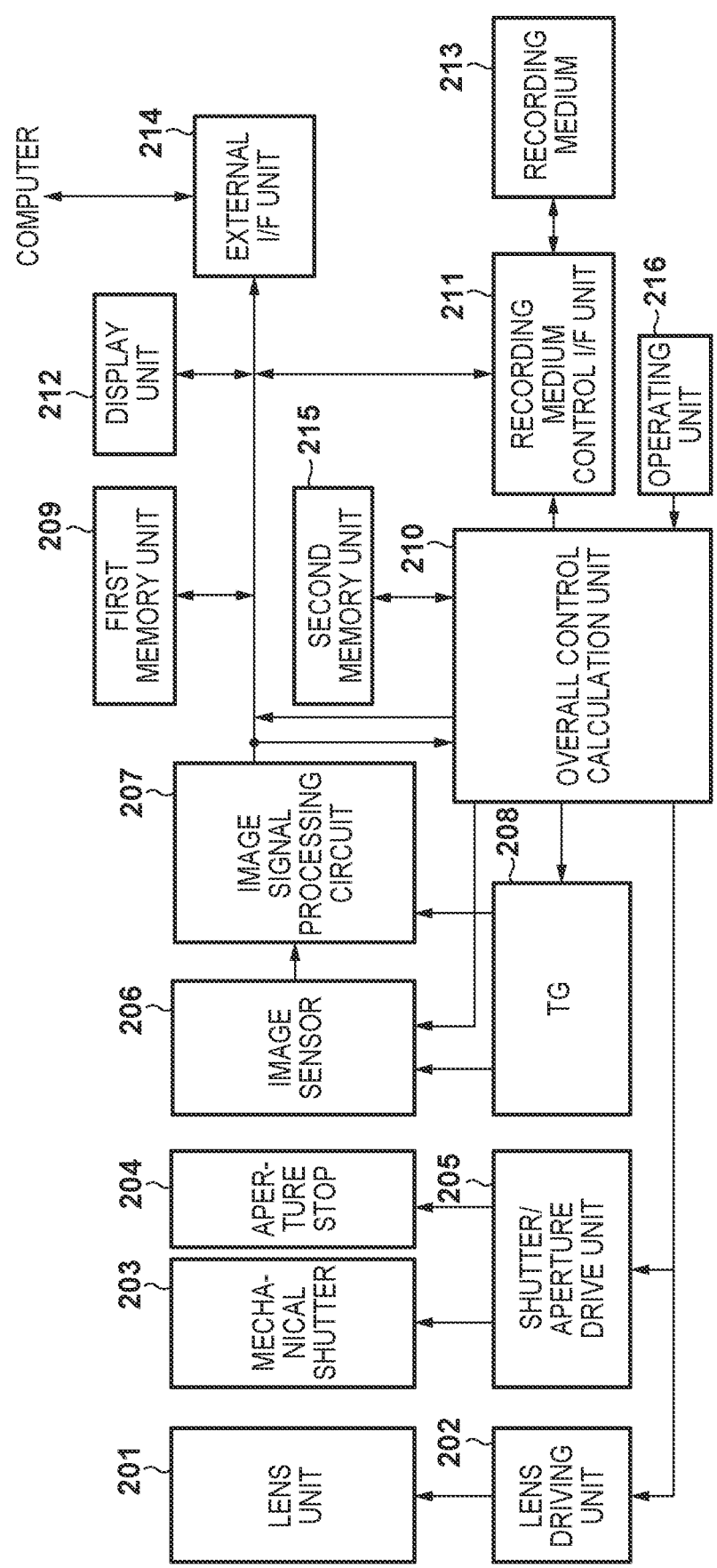
FIG. 1 is a block diagram illustrating the overall configuration of an image capturing apparatus according to an embodiment.
Figure 2:
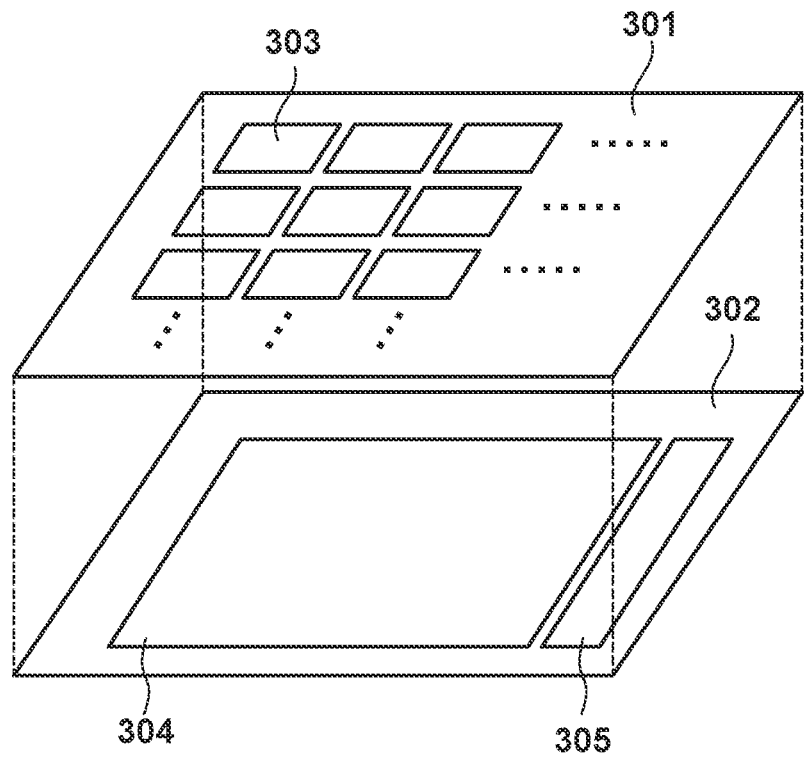
FIGS. 2A and 2B are diagrams illustrating a configuration of an image sensor according to the embodiment.

Hereinafter, embodiments will be described in detail with reference to the attached drawings. Note, the following embodiments are not intended to limit the scope of the claimed invention, and limitation is not made an invention that requires a combination of all features described in the embodiments. Two or more of the multiple features described in the embodiments may be combined as appropriate. Furthermore, the same reference numerals are given to the same or similar configurations, and redundant description thereof is omitted.

Hereinafter, an image capturing apparatus using a photon counting type image sensor according to the present embodiment will be described with reference to FIGS. 1 to 6B.

FIG. 1 is a block diagram illustrating the overall configuration of an image capturing apparatus according to the first embodiment. In FIG. 1, a lens unit 201 is constituted by a plurality of lenses including a zoom lens, and changes a focal length from a wide end to a tele end under the control of a lens drive unit 202.

A mechanical shutter 203, and an aperture stop 204 (a light amount adjusting member) in the following stage, constitute an exposure amount adjusting mechanism that mechanically controls an illumination time of light incident on an image sensor 206. The shutter 203 and the aperture stop 204 are driven and controlled by a shutter/aperture drive unit 205.

A subject image that has traversed the lens unit 201 including the zoom lens is formed on the image sensor 206 at an exposure amount adjusted to an appropriate amount by the shutter 203 and the aperture stop 204. The subject image, which is formed on a plurality of pixels in the image sensor 206, is converted into two-dimensional digital data in the image sensor 206, which is then sent to an image signal processing circuit 207. The image sensor 206 will be described in detail later.

The image signal processing circuit 207 generates image data by carrying out various types of image signal processing such as low-pass filtering for reducing noise, shading correction, WB adjustment, and the like, as well as various types of correction such as defect correction, dark shading correction, and black subtraction, compression, and the like.

An overall control calculation unit 210 carries out control of and various types of operations for the image capturing apparatus as a whole. A timing generator (TG) 208 generates a drive pulse for driving the image sensor 206 on the basis of a control signal from the overall control calculation unit 210. A first memory unit 209 temporarily stores the image data.

A recording medium control interface (I/F) unit 211 records image data to, and reads out image data from, a recording medium 213, which is a removable storage medium such as semiconductor memory. A display unit 212 displays image data and the like. An external interface (I/F) unit 214 is an interface for communicating with an external computer or the like.

A second memory unit 215 stores various types of parameters, such as processing results from the overall control calculation unit 210, shooting conditions, and so on. Information regarding driving conditions of the image capturing apparatus set by a user through an operating unit 216 is sent to the overall control calculation unit 210, and the image capturing apparatus is controlled as a whole on the basis of that information.

FIGS. 2A and 2B illustrate the overall structure of the image sensor 206. In the present embodiment, as an example, a sensor substrate 301 and a circuit board 302 are stacked so as to be electrically connected, providing the image sensor with a stacked structure.

As illustrated in FIG. 2A, a pixel array is formed on the sensor substrate 301 by arranging a plurality of pixels 303 two-dimensionally. The configuration of the pixel 303 will be described in greater detail later. A pixel computation unit 304 and a signal processing circuit 305 are formed on the circuit board 302.

The pixel computation unit 304 is electrically connected to the pixels on the sensor substrate 301 by bumps or the like. The pixel computation unit 304 outputs control signals for driving the pixels 303, and carries out various types of processing upon receiving comparator outputs from the pixels 303.

The pixel computation unit 304 includes a counter circuit that measures the number of pulse signals from the comparators output in response to photons entering the corresponding pixels. A count value obtained by the pixel computation unit 304 is output to the exterior of the image sensor 206 by the signal processing circuit 305.

FIG. 2B is a diagram illustrating part of a color filter array used in the image sensor 206, and a color filter of one of a plurality of colors is arranged on each pixel 303 included in the pixel array illustrated in FIG. 2A. This color filter arrangement is known as a Bayer array, in which a first color filter of red (R), a second color filter of green (Gr), a third color filter of green (Gb), and a fourth color filter of blue (B) are arranged in a repeating pattern. Among primary color filter arrangements, this arrangement provides a high resolution and excellent color reproduction.

In the present embodiment, the plurality of pixels 303 are divided into Group 1 to Group 9 so that the exposure time can be independently controlled for each group.

Figure 3:
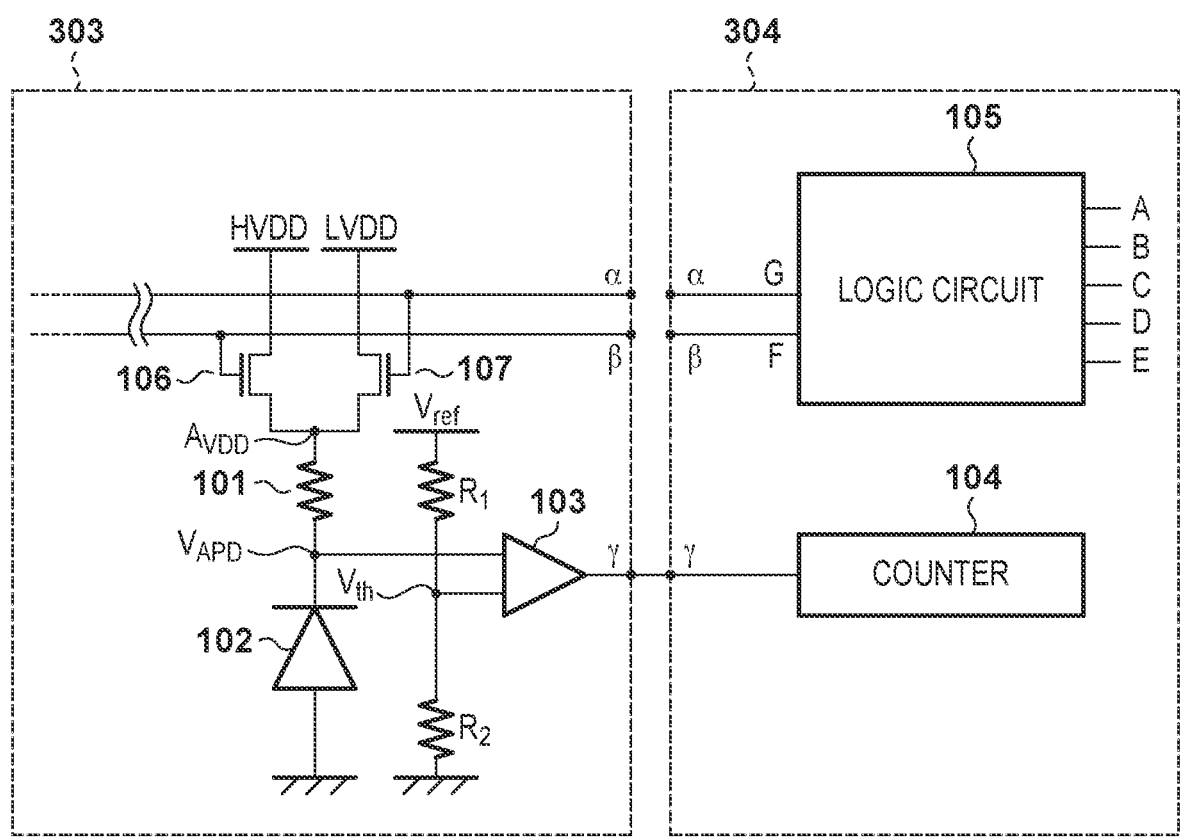
FIG. 3 is a diagram illustrating a configuration of a pixel and a part of a pixel calculation unit according to the embodiment.

Next, with reference to FIG. 3, a partial configuration of the pixel 303 and the pixel computation unit 304 will be described. FIG. 3 shows an equivalent circuit of the pixel 303 on the sensor substrate 301 and a part of the pixel computation unit 304 on the circuit board 302 corresponding to the pixel 303.

The pixel 303 includes a quenching resistor 101, an APD 102 as a light receiving element, a comparator 103, resistors $R_1$ and $R_2$ for generating the threshold voltage $V_{th}$, and switches 106 and 107, and is arranged on the sensor substrate 301. The other pixels included in the pixel array have the same configuration. The pixel computation unit 304 includes a counter 104 and a logic circuit 105 corresponding to each pixel 303, and is arranged on the circuit board 302.

An anode terminal of the APD 102 is grounded (GND) and a cathode terminal is connected to the quenching resistor 101. Then, a reverse bias voltage is applied to the APD 102 via the quenching resistor 101 and the switches 106 and 107. In the present embodiment, the voltage HVDD and the voltage LVDD lower than the voltage HVDD are supplied as the reverse bias voltage. Here, the voltage LVDD may be a voltage lower than the voltage HVDD, and includes, for example, a state where no voltage is supplied (0V). The switches 106 and 107 switch so that a node $A_{VDD}$ of the quenching resistor 101 opposite to the node to which the APD 102 is connected is connected to one of the voltage supply sources of voltages HVDD and LVDD.

The logic circuit 105 is connected to the switch 106 and the switch 107. Although details will be described later with reference to FIGS. 4A to 4J, in the present embodiment, the pixel computation unit 304 has logic circuits 105 having nine different configurations, and each pixel 303 is connected to the logic circuit 105 having the configuration corresponding to the group to which the pixel 303 belongs among Groups 1 to 9.

Each logic circuit 105 has five input terminals A to E, and receives a signal of either High or Low level from the TG 208, respectively. Further, the logic circuit 105 has two output terminals F and G, and outputs signals of different levels according to the levels input to the input terminals A to E. The switches 106 and 107 are controlled such that one of the switches 106 and 107 is ON and the other is OFF in accordance with the output of the output terminals F and G of the logic circuit 105.

The voltage difference between the voltages HVDD and GND is set to be equal to or higher than a breakdown voltage (hereinafter, referred to as "VBR") in order to drive the APD 102 in Geiger mode. On the other hand, the voltage difference between the voltage LVDD and GND is set to be smaller than VBR.

The voltage $V_{APD}$ (output voltage) at the cathode terminal of the APD 102 is input to one input terminal of the comparator 103. The threshold voltage $V_{th}$ obtained by dividing the reference voltage $V_{ref}$ by the resistors R1 and R2 is input to the other input terminal of the comparator 103. The comparator 103 outputs a pulse signal in a case where the voltage $V_{APD}$ falls below and returns above the $V_{th}$ level. The pulse signal output from the comparator 103 is input to the counter 104, and the number of the pulse signals is counted.

Next, a configuration and a driving pattern of the logic circuit 105 will be described with reference to FIGS. 4A to 4I. The pixel computation unit 304 of the present embodiment has the logic circuits 105 having nine different configurations as shown in FIGS. 4A to 4I, and each logic circuit 105 includes a plurality of AND circuits and NOT circuits. Hereinafter, the logic circuits 105 of the respective configurations shown in FIGS. 4A to 4I are referred to as logic circuits 105(1) to 105(9), respectively. Output terminals F and G of the logic circuits 105(1) to 105(9) are connected to the switches 106 and 107 of the pixels of the pixel groups Group 1 to Group 9, respectively. Also, signals of the same level are input to the input terminals A to E of the logic circuits 105(1) to 105(9), respectively, and controlled by the TG 208.

FIG. 4J shows the levels of the signals input to the input terminals A to E of the logic circuits 105(1) to 105(9). There are patterns (1) to (11) of combinations of H level and L level of the signals, and the input signals to the input terminals A to E are input from the TG 208.

In the pattern (1), only the logic circuit 105(1) outputs the H level from the output terminal F and the L level from the output terminal G, and the other logic circuits 105(2) to 105(9) output L level from the output terminals F and output H level from the output terminals G. As a result, only the pixels 303 of Group 1 have the switches 106 turned on and the switches 107 turned off, the nodes A of the quenching resistors 101 connected to the voltage source HVVD, and the APDs 102 driven in Geiger mode.

On the other hand, in the pixels 303 of Group 2 to Group 9, the switches 106 are turned off and the switches 107 are turned on, and the nodes A of the quenching resistors 101 are connected to the voltage source LVDD, so that the APDs 102 are not driven in Geiger mode. Therefore, only the pixels 303 of Group 1 can count the number of incident photons.

Hereinafter, the state in which the APD 102 of the pixel 303 is driven in Geiger mode is expressed as "the pixel 303 is turned on". Conversely, a state in which the APD 102 of the pixel 303 is not driven in Geiger mode is expressed as "the pixel 303 is turned off".

In the patterns (2) to (9), only one of the logic circuits 105(2) to 105(9) outputs H level from the output terminal F and L level from the output terminal G, and the pixels 303 belonging to one of Groups 2 to 9 are turned ON, respectively.

In the pattern (10), L level is output from the output terminals F and H level is output from the output terminals G of all the pixels 303 of Group 1 to Group 9. As a result, the nodes A of the quenching resistors 101 of all the pixels 303 are connected to the voltage LVDD, and all the pixels 303 are turned OFF.

In the pattern (11), H level is output from the output terminals F and L level is output from the output terminals G of all the pixels 303 of Group 1 to Group 9. As a result, the nodes A of the quenching resistors 101 of all the pixels 303 are connected to the voltage HVDD, and all the pixels 303 are turned on. Becomes ON.

Next, drive control of the image sensor 206 in the present embodiment using the above configuration will be described with reference to FIGS. 5, 6A, and 6B. Here, as an example, a case of driving the image sensor 206 in the moving image mode with three-pixel-addition or three-pixel-thinning in the horizontal direction and the vertical direction will be described.

FIGS. 5A to 5D show the transition of a voltage value VA of the node $A_{VDD}$ of the quenching resistor 101 of each pixel of Group 1 to Group 9 with respect to time. A state in which the node $A_{VDD}$ is connected to the voltage HVDD is expressed as High (VA≥VBR), and a state in which the node $A_{VDD}$ is connected to the voltage LVDD is expressed as Low (VA<VBR). While the voltage value VA is High, the pixel 303 is turned on.

FIG. 6A shows an example of the arrangement of pixel groups in the present embodiment. R, Gr, Gb, B described in each frame indicate a color filter used in each pixel, and numerals 1 to 9 described in each square indicates any one of Group 1 to Group 9 to which each pixel belongs. In this arrangement, the three-pixel-addition or the three-pixel-thinning processing in the horizontal and vertical directions is performed between pixels of the same color and labelled with 1 to 9. For example, "R1" indicates that the pixel is a red (R) pixel and belongs to Group 1, and pixel addition or pixel thinning processing is performed among nine pixels R1 to R9.

<Driving Method 1>

Figure 5A:
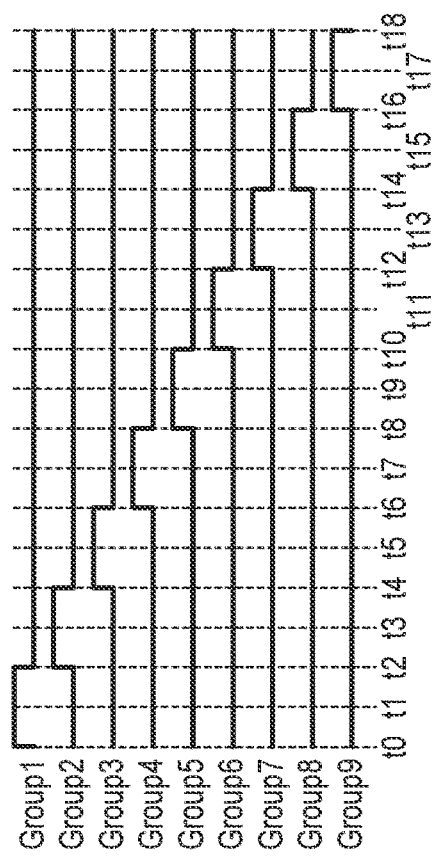
FIGS. 5A to 5D are timing charts showing driving methods according to the embodiment.

FIG. 5A shows a case where only the pixels of Group 1 is turned on. In FIG. 5A, from time t0 to time t18, the signals of the pattern (1) shown in FIG. 4J, that is low level signals, are input to the input terminals A, B, C, D, and E of the logic circuits 105 of the image sensor 206 from the TG 208.

Due to the above input, only the voltage values VA of the pixels of Group 1 become High, and the voltage values VA of the pixels of Group 2 to Group 9 become Low. Therefore, only the pixels of Group 1 (R1, Gr1, Gb1, and B1 in FIG. 6A) are turned on, and photons are counted for the pixels of Group 1.

Then, at time t18, the signals of the pattern (10) are input from the TG 208 to the input terminals A, B, C, D, and E of the logic circuits 105 of the image sensor 206. As a result, the voltage values VA of all the pixels in Group 1 to Group 9 become Low, Group 1 is also turned off, and the counting of photons is completed.

A pulse signal is output from the comparator 103 with respect to each photon that has entered the pixel of the Group 1 during the ON period, and is counted by the counter 104. The obtained count value is converted by the signal processing circuit 305 into digital two-dimensional data in which pixels of Group 2 to Group 9 outputting no signal are thinned out and sent to the image signal processing circuit 207. The image signal processing circuit 207 performs various correction processing, image processing, compression, and the like to create moving image data.

By the above operation, only ⅑ of the pixels of the image sensor 206 are turned on, so that the power required for shooting can be significantly reduced as compared with the case where all the pixels are turned on at the same time.

<Driving Method 2>

In the driving method shown in FIG. 5A, only ⅑ of all the pixels are turned on, so that the final output image is an image thinned out to ⅑, and the edge portion or contour portion in the image may be notched (called "jaggy", hereinafter). Therefore, an example of a driving method in which jaggies do not occur in the final output image and power consumption is reduced will be described with reference to FIG. 5B.

Figure 5B:
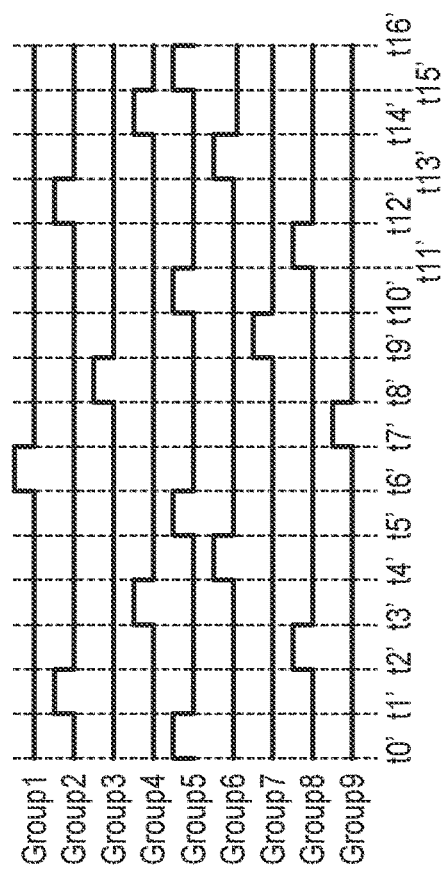

FIG. 5B shows a case where the pixels of Group 1 to Group 9 are sequentially turned on for each group. In FIG. 5B, the signals of the pattern (1) are input from TG 208 to the input terminals A, B, C, D, and E of the logic circuits 105 of image sensor 206 from time t0 to time t2. As a result, only the voltage values VA of the pixel of the Group 1 becomes High, and the voltage values VA of the other pixels become Low. Therefore, only the pixels of the Group 1 (R1, Gr1, Gb1, Gb1, and Gb1 in FIG. 6A) are turned on between time t0 and time t2, and photons are counted for the pixels of the Group 1.

Next, from time t2 to time t4, the signals of the pattern (2) is input from the TG 208 to the input terminals A, B, C, D, and E of the logic circuits 105 of the image sensor 206. As a result, only the voltage values VA of the pixels of the Group 2 become High, and the voltage values VA of the other pixels become Low. Therefore, between the time t2 and the time t4, only the pixels of the Group 2 (R2, Gr2, Gb2, and B2 in FIG. 6A) are turned on, and photons are counted for the pixels of the Group 2.

Similarly, from time t4 to time t18, the voltage values VA of the pixels are sequentially set to High from the pixels of Group 3 to the pixels of Group 9. As a result, all the pixels of Group 1 to Group 9 are sequentially turned on until time t18, and a series of driving control is completed.

A pulse signal is output from the comparator 103 with respect to each photon incident on each pixel during the ON period, and counted by the counter 104. The obtained count values from adjacent same-color pixels are added by the signal processing circuit 305 for each of Group 1 to Group 9. For example, for the R pixels in FIG. 6A, the count values of nine pixels R1 to R9 are added. The added count values are further converted to digital two-dimensional data and sent to the image signal processing circuit 207. The image signal processing circuit 207 performs various correction processing, image processing, compression, and the like to create moving image data.

Due to the above operation, only ⅑ of the pixels on the image sensor 206 are turned on at the same time, so that the power required for shooting is greatly reduced comparing to a case where all the pixels are turned on at the same time. Further, in the driving method shown in FIG. 5B, since an image is created by adding a plurality of signals, jaggies do not occur as compared with the driving method shown in FIG. 5A.

<Driving Method 3>

In the exposure control as shown in FIG. 5B, since signals of nine pixels are added, the resolution is reduced. Therefore, an example of a driving method for reducing power consumption while further considering the sense of resolution will be described with reference to FIG. 5C.

Figure 5C:
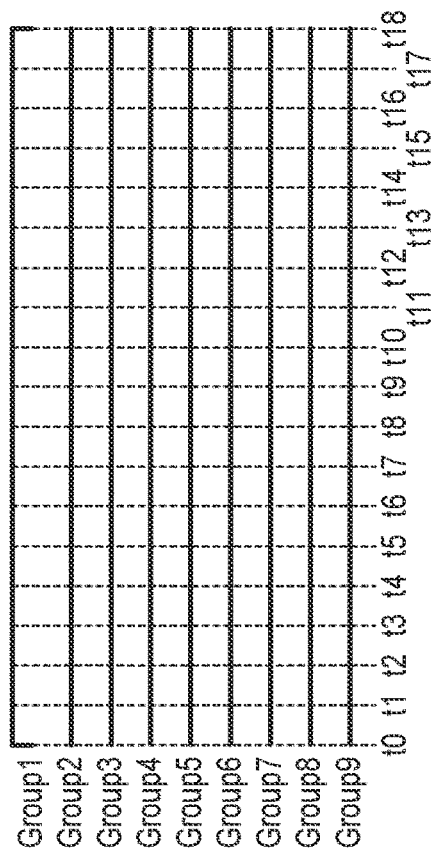

FIG. 5C also shows a case where pixels are sequentially turned on from Group 1 to Group 9 and read out, similarly to FIG. 5B. The difference from the driving method shown in FIG. 5B is that, in FIG. 5C, Group 1 to Group 9 are weighted so that the ON time of the pixel group of interest is longer than the ON time of the other pixel groups. In the present embodiment, Group 5 is set as the target pixel group and assigned with a weight of "4", Groups 2, 4, 6, and 8 that are closer to Group 5 are assigned with a weight of "2", and Groups 1, 3, 7, and 9 that are slightly far from Group 5 are assigned with weight of "1". Then, the ON time is set according to the weight.

FIG. 6B shows the weights described above by pixels. In FIG. 6B, the pixels (Group 5) hatched with a backslash pattern are pixels having the weight of "4" and have the longest ON time. The pixels (Groups 2, 4, 6, and 8) hatched with an oblique line pattern are pixels having the weight of "2", and have an ON time that is ½ of the ON time of the pixels hatched with the backslash pattern. The pixels (Groups 1, 3, 7, and 9) with no hatching are pixels having the weight of "1", and have an ON time that is ¼ of the ON time of the pixels hatched with the backslash pattern.

As shown in FIG. 5C, the pixels of Group 1 are turned on during the period from time t0' to time t1' using the signals of the pattern (1). The pixels of Group 2 are turned on between time t1' and time t3' using the signals of the pattern (2). The pixels of Group 3 are turned on during the period from time t3' to time t4' using the signals of the pattern (3), and the pixels of Group 4 are turned on during the period from time t4' to time t6' using signals of the pattern (4).

The pixels of Group 5 are turned on during the period from time t6' to time t10' using the signals of the pattern (5), and the pixels of Group 6 are turned on during the period from time t10' to time t12' using signals of the pattern (6). The pixels of Group 7 are turned on during the period from time t12' to time t13' using the signals of the pattern (7), and the pixels of Group 8 are turned on during the period from time t13' to time t15' using signals of the pattern (8).

Then, the pixels of Group 9 are turned on during the period from time t15' to time t16' using the signals of the pattern (9). As described above, it is controlled so that the ON time of the pixels of Group 5 having the weight of "4" is four times the ON time of pixels of Groups 1, 3, 7, and 9 having the weight of "1", and is twice the ON time of the pixels of Group 2, 4, 6, and 8 having the weight of "2".

The processing of generating the moving image data from the count values obtained under the above control is the same as that in the case of FIG. 5B, and the description thereof is omitted.

With the above operation, since only ⅑ of the pixels on the image sensor 206 are turned on at the same time, it is possible to greatly reduce the power required for shooting comparing to a case where all the pixels are turned on at the same time.

Further, as compared with the driving method of FIG. 5B, since the count values obtained by weighting the pixels from the pixels of Group 5 to the surrounding pixels of other groups are added, edge is emphasized, and deterioration in the resolution of the final output image is reduced.

<Driving Method 4>

In the operation methods shown in FIGS. 5B and 5C, since the pixels are sequentially turned on from Group 1 to Group 9, when the subject is moving, the subject distortion is easily noticeable. Therefore, an example of a driving method for reducing subject distortion will be described with reference to FIG. 5D.

Figure 5D:
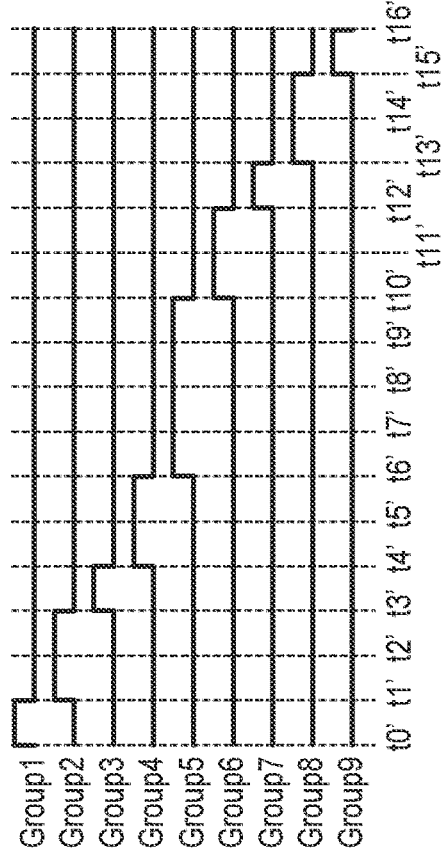
Figure 7A:
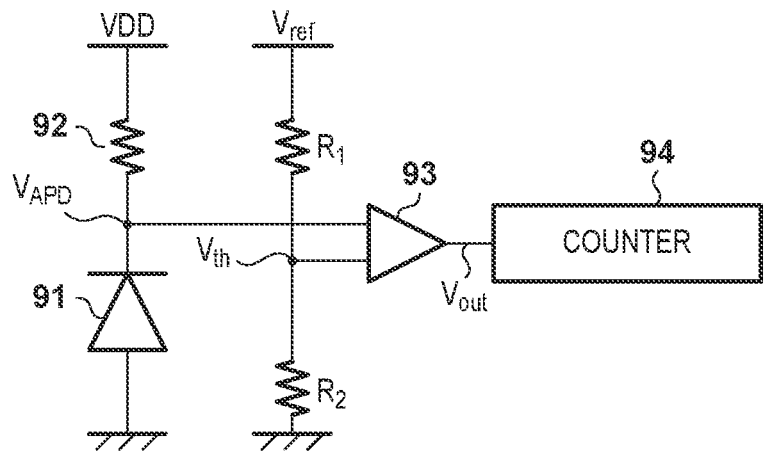
FIGS. 7A to 7C are diagrams pertaining to a photon counting type image sensor according to a conventional technique.
Figure 7B:
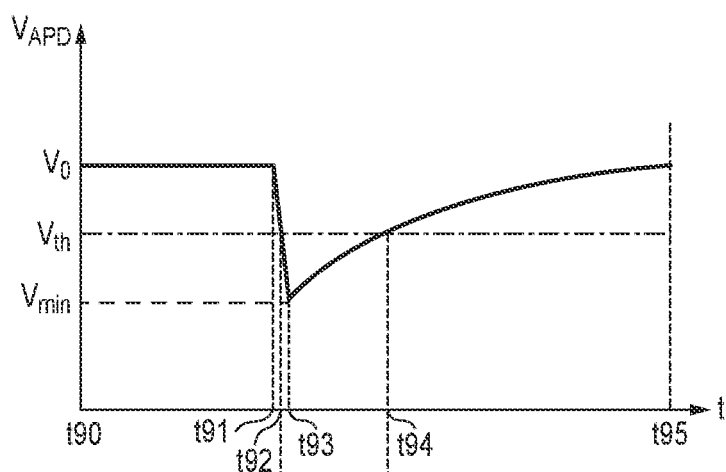
Figure 7C:

In the operation of FIG. 5D, the weighting of each pixel group is the same as that in the case of FIG. 5C. Therefore, the total ON time of each pixel group is the same as that of FIG. 5C. However, in the operation of FIG. 5D, it is controlled so that ON time of pixels in each pixel group is discretely arranged over time and the order of turning on the pixels is controlled so that locations of the turned-on pixels are not biased.

More specifically, first, during time t0' to time t1', the pixels of Group 5 are turned on using the signals of pattern (5). Next, from time t1' to time t2', the pixels of Group 2 are turned on using the signals of pattern (2). Then, during time t2' to time t3', the pixels of Group 8 are turned on using the signals of the pattern (8), and during time t3' to the time t4', the pixels of Group 4 are turned on using the signals of the pattern (4).

Similarly, pixels are turned on in the order of Groups 6, 5, 1, 9, 3, 7, 5, 8, 2, 6, 4, and 5 using signals of the patterns (1) to (9). In this way, the turning-on timing is controlled such that the pixels of Group 5 having a weight of "4" are discretely turned on four times, the pixels of Groups 2, 4, 6, and 8 having a weight of "2" are discretely turned on twice, and the pixels of Groups 1, 3, 7, and 9 having a weight of "1" are turned ON once.

The processing of generating the moving image data from the count values obtained under the above control is the same as that in the case of FIG. 5B, and the description thereof is omitted.

By driving the turning-on timing as shown in FIG. 5D, it is possible to suppress the influence on the image (distortion of the object) due to the shift of the ON time when the moving object is shot, as compared with the driving method of FIGS. 5B and 5C.

With the above operation, since only ⅑ of the pixels on the image sensor 206 are turned on at the same time, it is possible to greatly reduce the power required for shooting comparing to a case where all the pixels are turned on at the same time.

In addition, by devising the order in which the pixels are turned on and the weight of the ON time, it is possible to perform driving in consideration of jaggies, reduction in resolution, and object distortion.

In the example described above, a case has been described in which pixels are controlled by dividing them into nine pixel groups. However, the present invention is not limited to this. For example, the pixels may be divided into four pixel groups or 16 pixel groups.

Also, the input signals to the input terminals A, B, C, D, and E have been described as being input from the TG 208. However, the input signals may be generated in the image sensor 206 in response to the timing signal from the TG 208.

Further, in the above-described example, a case has been described in which the pixels of one of Groups 1 to 9 or the pixels of all of Groups 1 to 9 are turned on, but the present invention is not limited to this. A driving method of selecting the pixels of Groups 1 to 9 in units of pixel group using the above-described configuration and input signals may be used, for example, and it is possible to drive the image sensor 206 with a variety of driving methods so that signals required for a desired image are obtained.

Further, in the above-described example, the case where the voltage HVDD and the voltage LVDD are switched and supplied by turning on/off the switches 106 and 107 has been described. However, if different voltages can be switched and supplied, a configuration different from the configuration shown in FIG. 3 may be used. For example, a switch connected to one of the voltage HVDD and the voltage LVDD may be configured to connect to the voltage HVDD when the output of the output terminal F is High and to the voltage LVDD when the output of the output terminal F is Low. In that case, the configuration of the output terminal G of the logic circuit 105 becomes unnecessary.

Other Embodiments

The present invention may be applied to a system including a plurality of devices (for example, a host computer, an interface device, a camera, and the like) or may be applied to an apparatus formed as a single device.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-039808, filed on Mar. 5, 2019 which is hereby incorporated by reference herein in its entirety.

What is claimed is:

1. An image sensor comprising:
a plurality of pixels each including an avalanche photodiode; and
a control unit that controls, for each of a plurality of pixel groups which are obtained by dividing the plurality of pixels, to supply either of a first voltage and a second voltage as a reverse bias voltage of the avalanche photodiodes, wherein the first voltage is greater than a breakdown voltage of the avalanche photodiodes and the second voltage is smaller than the breakdown voltage,
wherein the control unit includes a plurality of logic circuits, each having a plurality of input terminals, that have different configurations from each other and correspond to the plurality of pixel groups, respectively, wherein the plurality of logic circuits output different output signals with respect to a same combination of signals input to the plurality of input terminals as control signals for controlling the reverse bias voltage, and
wherein the control unit is implemented by (a) one or more processors, (b) circuitry, or (c) a combination thereof.

2. The image sensor according to claim 1, wherein the control unit controls to perform thinning readout of signals from the plurality of pixels by (a) supplying the first voltage to the pixels that belong to one of the plurality of pixel groups, and (b) supplying the second voltage to other pixels of the plurality of pixels.

3. The image sensor according to claim 1, wherein the control unit controls to sequentially read out signals from the plurality of pixels by (1) performing control of (a) supplying the first voltage to the pixels that belong to a selected one of the plurality of pixel groups and (b) supplying the second voltage to the pixels that belong to other of the plurality of pixel groups and (2) repeating the performing while sequentially shifting the selection from pixel group to pixel group of the plurality of pixel groups.

4. The image sensor according to claim 3, wherein the control unit assigns weights to the plurality of pixel groups, and sets a period of time when the first voltage is supplied to each of the plurality of pixel groups in accordance with the weights.

5. The image sensor according to claim 4, wherein the control unit discretely sets the period of time when the first voltage is supplied.

6. The image sensor according to claim 1, further comprising:
a first supply circuit that supplies the first voltages; and
a second supply circuit that supplies the second voltage,
wherein the control unit selects either of the first supply circuit and the second supply circuit such that either of the first voltage and the second voltage is supplied.

7. The image sensor according to claim 6, wherein each of the plurality of pixels includes (a) a first switch that selects the first supply circuit and (b) a second switch that selects the second supply circuit, and
wherein the first switch and the second switch are controlled by the control unit.

8. The image sensor according to claim 1, further comprising a counter that (a) counts a number of pulse signals generated based on output of each avalanche photodiode and (b) outputs a count value.

9. An image capturing apparatus comprising:
an image sensor comprising: (1) a plurality of pixels each including an avalanche photodiode; and (2) a control unit that controls, for each of a plurality of pixel groups which are obtained by dividing the plurality of pixels, to supply either of a first voltage and a second voltage as a reverse bias voltage of the avalanche photodiodes, wherein the first voltage is greater than a breakdown voltage of the avalanche photodiodes and the second voltage is smaller than the breakdown voltage, and
wherein the control unit includes a plurality of logic circuits, each having a plurality of input terminals, that have different configurations from each other and correspond to the plurality of pixel groups, respectively, wherein the plurality of logic circuits output different output signals with respect to a same combination of signals input to the plurality of input terminals as control signals for controlling the reverse bias voltage, and a unit that supplies the signals to be input to the plurality of input terminals of each of the plurality of logic circuits, wherein each unit is implemented by (a) one or more processors, (b) circuitry, or (c) a combination thereof.

10. An image processing apparatus comprising:
an image sensor comprising: (1) a plurality of pixels each including an avalanche photodiode; (2) a control unit that controls, for each of a plurality of pixel groups which are obtained by dividing the plurality of pixels, to supply either of a first voltage and a second voltage as a reverse bias voltage of the avalanche photodiodes, wherein the first voltage is greater than a breakdown voltage of the avalanche photodiodes and the second voltage is smaller than the breakdown voltage, wherein the control unit includes a plurality of logic circuits, each having a plurality of input terminals, that have different configurations from each other and correspond to the plurality of pixel groups, respectively, wherein the plurality of logic circuits output different output signals with respect to a same combination of signals input to the plurality of input terminals as control signals for controlling the reverse bias voltage; and (3) counters that (a) count numbers of pulse signals generated based on output of the avalanche photodiodes and (b) output count values; and
a processing unit that processes the count values output from the image sensor and generates image data,
wherein each unit is implemented by (a) one or more processors, (b) circuitry, or (c) a combination thereof.

11. A control method of controlling an image sensor that comprises a plurality of pixels each including an avalanche photodiode, the method comprising:
controlling, for each of a plurality of pixel groups which are obtained by dividing the plurality of pixels, to supply either of a first voltage and a second voltage as a reverse bias voltage of the avalanche photodiodes, wherein the first voltage is greater than a breakdown voltage of the avalanche photodiodes and the second voltage is smaller than the breakdown voltage,
wherein the controlling uses a plurality of logic circuits, each having a plurality of input terminals, that have different configurations from each other and correspond to the plurality of pixel groups, respectively, wherein the plurality of logic circuits output different output signals with respect to a same combination of signals input to the plurality of input terminals as control signals for controlling the reverse bias voltage.

12. A non-transitory computer-readable storage medium, the storage medium storing a program that is executable by the computer, wherein the program includes program code for causing the computer to perform a control method of controlling an image sensor that comprises a plurality of pixels each including an avalanche photodiode, the method comprising:
controlling, for each of a plurality of pixel groups which are obtained by dividing the plurality of pixels, to supply either of a first voltage and a second voltage as a reverse bias voltage of the avalanche photodiodes, wherein the first voltage is greater than a breakdown voltage of the avalanche photodiodes and the second voltage is smaller than the breakdown voltage,
wherein the controlling uses a plurality of logic circuits, each having a plurality of input terminals, that have different configurations from each other and correspond to the plurality of pixel groups, respectively, wherein the plurality of logic circuits output different output signals with respect to a same combination of signals input to the plurality of input terminals as control signals for controlling the reverse bias voltage.

* * * * *